United States Patent
Roemer et al.

(10) Patent No.: US 6,181,567 B1
(45) Date of Patent: Jan. 30, 2001

(54) METHOD AND APPARATUS FOR SECURING AN ELECTRONIC PACKAGE TO A CIRCUIT BOARD

(75) Inventors: Robert W. Roemer; Eddie V. Williams, both of Columbia, SC (US)

(73) Assignee: NCR Corporation, Dayton, OH (US)

( * ) Notice: Under 35 U.S.C. 154(b), the term of this patent shall be extended for 0 days.

(21) Appl. No.: 08/869,033

(22) Filed: Jun. 4, 1997

(51) Int. Cl.[7] ................................ H05K 1/18; H05K 7/02
(52) U.S. Cl. .................. 361/760; 361/761; 361/735; 361/767; 361/770; 361/801; 361/807; 174/52.1; 174/255; 174/260; 439/68; 439/69; 439/71; 439/73; 257/774; 257/737; 257/738; 257/686
(58) Field of Search .................................. 361/760, 761, 361/735, 742, 767, 770, 801, 807; 174/52.1, 52.4, 255, 260; 439/68–73, 620; 257/774, 737, 738, 686, 676

(56) References Cited

U.S. PATENT DOCUMENTS

| | | | |
|---|---|---|---|
| 5,027,253 | * | 6/1991 | Lauffer et al. ................ 361/321.4 |
| 5,099,392 | | 3/1992 | Miller et al. ...................... 361/400 |
| 5,288,238 | | 2/1994 | Ikenaka et al. ...................... 439/91 |
| 5,296,652 | | 3/1994 | Miller, Jr. .......................... 174/265 |
| 5,315,481 | | 5/1994 | Smolley ............................. 361/707 |
| 5,321,583 | | 6/1994 | McMahon ......................... 361/770 |
| 5,383,787 | * | 1/1995 | Swifky et al. ...................... 439/67 |
| 5,413,489 | * | 5/1995 | Switky .............................. 439/71 |
| 5,459,287 | | 10/1995 | Swamy ............................. 174/266 |
| 5,575,686 | * | 11/1996 | Noschese ......................... 439/620 |
| 5,926,371 | * | 7/1999 | Dolbear ............................ 361/704 |
| 5,975,915 | * | 11/1999 | Yamazaki et al. ................. 439/72 |

* cited by examiner

Primary Examiner—Jeffrey Gaffin
Assistant Examiner—David Foster
(74) Attorney, Agent, or Firm—Maginot, Addison & Moore (57) ABSTRACT

A method of securing an electronic package to a circuit board includes the step of providing a retainer having a locating cavity defined therein. The method further includes the step of positioning the electronic package within the locating cavity so that the electronic package is fixed in relationship to the retainer. Moreover, the method includes the step of securing the retainer in fixed relationship to the circuit board so as to sandwich the electronic package between the retainer and the circuit board. The securing step is performed after the positioning step. An apparatus for securing an electronic package to a circuit board is also disclosed.

19 Claims, 8 Drawing Sheets

METHOD AND APPARATUS FOR SECURING AN ELECTRONIC PACKAGE TO A CIRCUIT BOARD

BACKGROUND OF THE INVENTION

The present invention relates generally to an electronic package, and more particularly to a method and apparatus for securing an electronic package to a circuit board.

Electronic packages typically include a number of integrated circuits which are housed within a plastic or ceramic package. Such packages, hereinafter referred to as "electronic packages", are generally rectangular or square in shape and include a plurality of conductive pads on a bottom surface thereof. The conductive pads may be arranged in a grid-like pattern to increase number or density of the conductive pads which may be included in the electronic package. One such type of grid-like pattern arrangement is referred to as a ball grid array package. In a ball grid array package, a finely-pitched matrix of spheroid- or ball-shaped conductive pads extend outwardly from the bottom surface of the electronic package.

A circuit board, such as a printed circuit board or a printed circuit assembly, to which the ball grid array package is to be mounted includes a corresponding number of conductive pads which are arranged in a similar matrix as the matrix of ball-shaped conductive pads included in the ball grid array package.

In order to mount the ball grid array package to the circuit board, a small quantity of a conductive metal alloy such as solder is placed on the conductive pads of the circuit board prior to placing and aligning the conductive pads of the ball grid array package thereon. Thereafter, the circuit board and the ball grid array package thereon are heated to a temperature which is greater in magnitude than the melting point of the solder thereby fusing the ball-shaped conductive pads of the ball grid array package to the conductive pads of the circuit board.

Although soldering the ball grid array package to the circuit board yields a strong, reliable mechanical and electrical connection, it may be undesirable if it becomes necessary at a later time to remove the ball grid array package from the circuit board. In particular, if it becomes necessary to repair or replace the ball grid array package that is soldered to the circuit board, the circuit board must again be heated to a temperature which is greater in magnitude than the melting point of the solder in order to remove the ball grid array package from the circuit board. Such re-heating of the circuit board may reduce the useful life of both the circuit board and the various other components secured thereto.

Soldering the electronic package is particularly undesirable during the development stages of a given electronic assembly. This is true since the various integrated circuits within the ball grid array package may require several design iterations during the development thereof. Hence, upon each occasion that the design of one of the integrated circuits is altered, the ball grid array package must be unsoldered, and a ball grid array package containing a revised version of the integrated circuit is thereafter soldered to the circuit board. As described above, such unsoldering and re-soldering may damage and/or destroy the circuit board and the other components secured thereto, thereby disadvantageously lowering yields and raising costs associated with the development of the electronic assembly. Moreover, the position of the electronic package on the circuit board and/or the configuration of the electronic package itself may prevent the electronic package from being removed from the circuit board in manner which does not irreparably damage the circuit board and/or the other components secured thereto. Hence, upon each occasion that the design of one of the integrated circuits is altered, the entire electronic assembly may have to be discarded thereby disadvantageously raising costs associated with the development of the electronic assembly.

To this end, a number of electronic package securing mechanisms such as sockets or other similar mechanical clamps have been developed to hold or otherwise secure an electronic package to a circuit board without the use of solder on the conductive pads of the electronic package. However, many of the electronic package securing mechanisms which have heretofore been designed are mechanically complex. Moreover, many of the electronic package securing mechanisms which have heretofore been designed require precision placement and alignment thereof on the circuit board by the use of expensive automated placement machines such as "pick and place" machines.

What is needed therefore is a method and apparatus for securing an electronic package to a circuit board which does not require the use of solder. In addition, what is needed is a method and apparatus for securing an electronic package to a circuit board which is relatively simple and inexpensive. Moreover, what is needed is a method and apparatus for securing an electronic package to a circuit board which does not require the use of automated placement machines. What is further needed is a method and apparatus for securing an electronic package to a circuit board which enables fast and simple removal and replacement of the electronic package.

SUMMARY OF THE INVENTION

In accordance with a first embodiment of the present invention, there is provided a method of securing an electronic package to a circuit board. The method includes the step of providing a retainer having a locating cavity defined therein The method further includes the step of positioning the electronic package within the locating cavity so that the electronic package is fixed in relationship to the retainer. Moreover, the method includes the step of securing the retainer in fixed relationship to the circuit board so as to sandwich the electronic package between the retainer and the circuit board. The securing step is performed after the positioning step.

In accordance with a second embodiment of the present invention, there is provided an apparatus for securing an electronic package to a circuit board. The apparatus includes a retainer securable to the circuit board. The retainer has a locating cavity defined therein. The electronic package is positionable within the locating cavity. The locating cavity is configured to prevent movement of the electronic package relative to the retainer when the electronic package is positioned within the locating cavity. The electronic package has a number of first conductive pads. The circuit board has a number of second conductive pads. The number of first conductive pads contacts the number of second conductive pads when (1) the electronic package is positioned within the locating cavity, and (2) the retainer is secured to the circuit board.

In accordance with a third embodiment of the present invention, there is provided an apparatus for securing an electronic package to a circuit board. The apparatus includes a retainer having a locating cavity defined therein. The retainer is securable to the circuit board. The electronic package is positionable within the locating cavity. The apparatus further includes a cloth interposer having anisotropic properties. The cloth interposer is positionable between the electronic package and the circuit board when the electronic package is sandwiched between retainer and the circuit board.

It is therefore an object of the present invention to provide a new and useful method for securing an electronic package to a circuit board.

It is also an object of the present invention to provide an improved method for securing an electronic package to a circuit board.

It is moreover an object of the present invention to provide a new and useful apparatus for securing an electronic package to a circuit board.

It is a further object of the present invention to provide an improved apparatus for securing an electronic package to a circuit board.

It is yet further an object of the present invention to provide a method and apparatus for securing an electronic package to a circuit board which does not require the electronic package to be soldered to the circuit board.

It is moreover an object of the present invention to provide a method and apparatus for securing an electronic package to a circuit board which is relatively simple and inexpensive.

It is also an object of the present invention to provide a method and apparatus for securing an electronic package to a circuit board which does not require the use of automated placement machines.

It is a further object of the present invention to provide a method and apparatus for securing an electronic package to a circuit board which enables fast and simple removal and replacement of the electronic package.

The above and other objects, features, and advantages of the present invention will become apparent from the following description and the attached drawings.

DETAILED DESCRIPTION OF THE INVENTION

While the invention is susceptible to various modifications and alternative forms, specific embodiments thereof have been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

Referring now to FIGS. 1–7, there is shown an electronic package securing assembly 10. The securing assembly 10 includes an retainer 12, a number of electronic packages 14, 15, a circuit board 16, a back plate 18, a number of bolts 20, and a number of nuts 22.

The electronic packages 14, 15 are configured in a ball grid array packaging arrangement as shown in FIGS. 2A, 2B, 3A, and 3B. In particular, the electronic packages 14, 15 include a number of sphere- or ball-shaped conductive pads 26 extending outwardly from a bottom surface 14e, 15e, respectively, thereof. Each of the electronic packages 14,15 further includes a housing 24. The housing 24 is made from an insulative material such as plastic or ceramic. Moreover, the ball-shaped conductive pads 26 are electrically coupled in a known manner to a number of integrated circuits 28 encapsulated within the housing 24.

Figure 4:
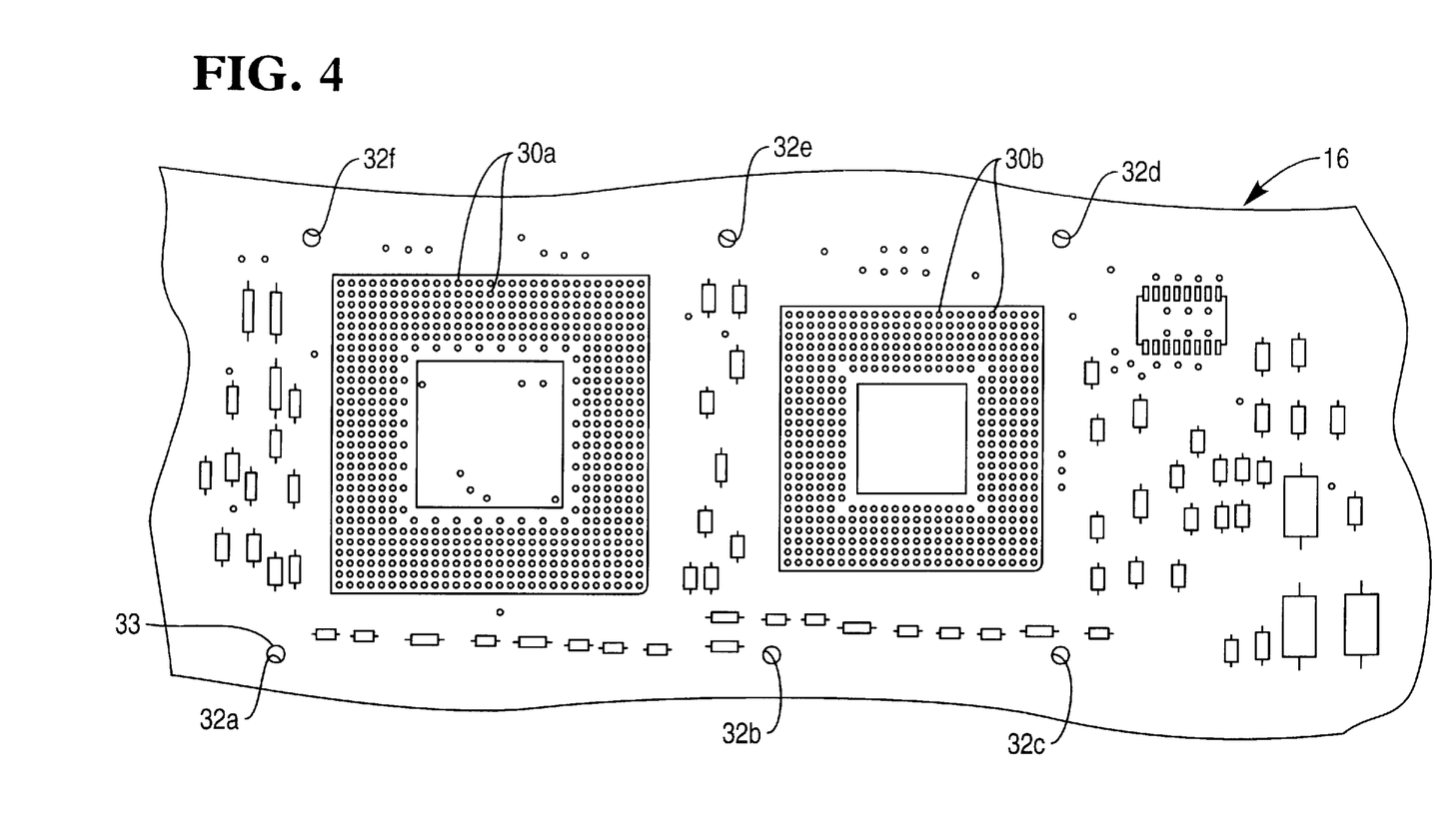
FIG. 4 is a reduced fragmentary top elevational view of the circuit board of the securing assembly of FIG. 1.

The circuit board 16 may be any known printed circuit board, printed circuit assembly, or the like. The circuit board 16 may be single-sided, double-sided, or multi-layered in construction. The circuit board 16 includes a number of surface mount type conductive pads 30a, 30b as shown in FIG. 4. It should be appreciated that the size and position of the conductive pads 30a, 30b correspond with the size and position of the ball-shaped conductive pads 26 of the electronic packages 14,15, respectively.

Moreover, the circuit board 16 has a number of board apertures 32a–f defined therein as shown in FIG. 4. It should be appreciated that the position of each of the conductive pads 30a, 30b may be measured relative to a center point 33 of the board aperture 32a. In particular, the location of a given conductive pad 30a or 30b may be defined as a first predetermined distance in the x-direction, and a second predetermined distance in the y-direction from the center point 33 of the board aperture 32a.

Figure 1:
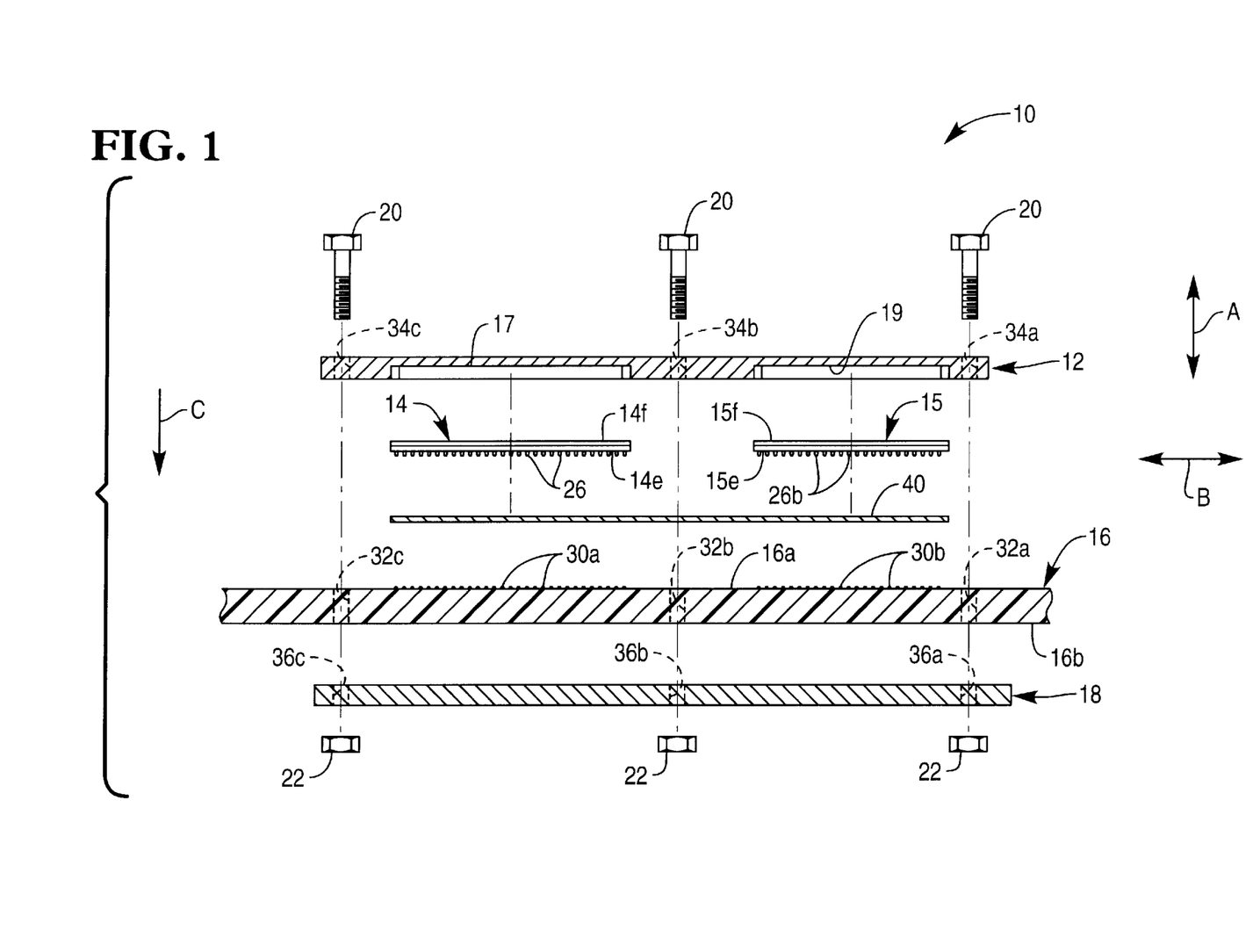
FIG. 1 is an exploded cross-sectional view a first embodiment of an electronic package securing assembly which incorporates the features of the present invention therein (Note: the electronic packages 14, 15 are not shown in cross-section for clarity of description)
Figure 2A:
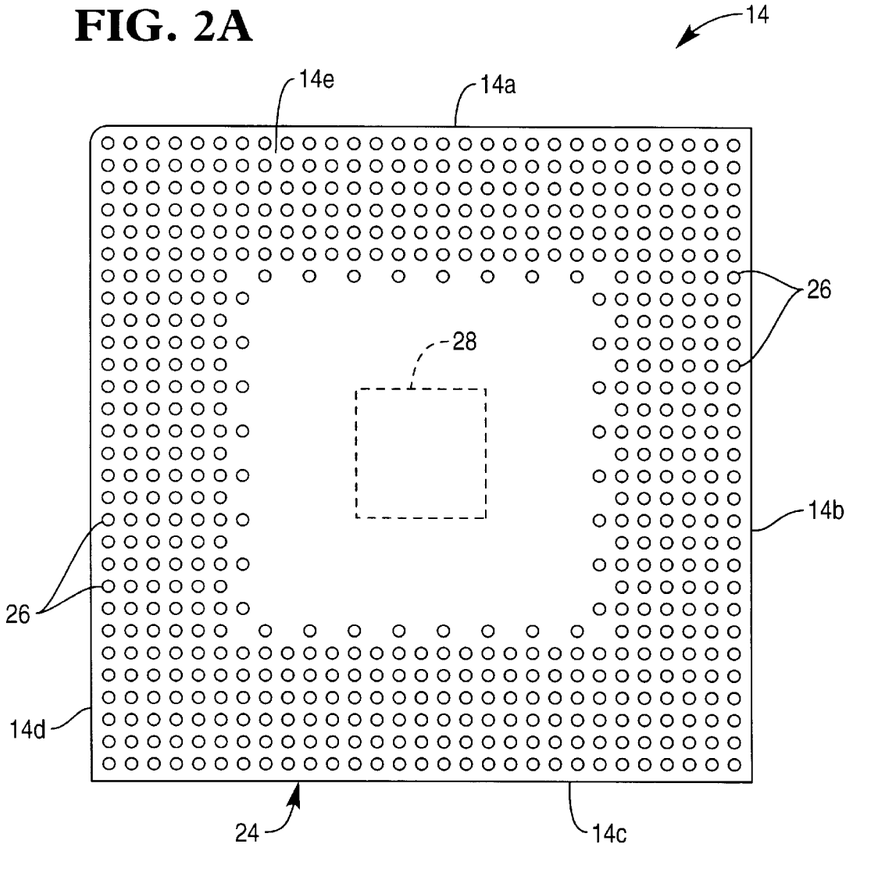
FIG. 2A is an enlarged bottom elevational view of the electronic package 14 of the securing assembly of FIG. 1.
Figure 2B:
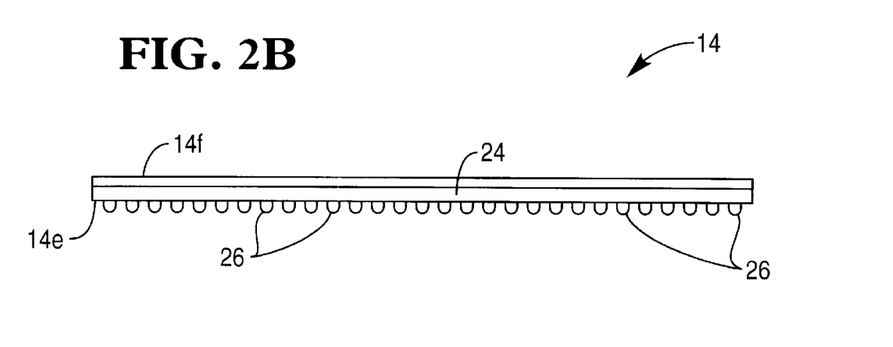
FIG. 2B is a side elevational view of the electronic package 14 of FIG. 2A.
Figure 3A:
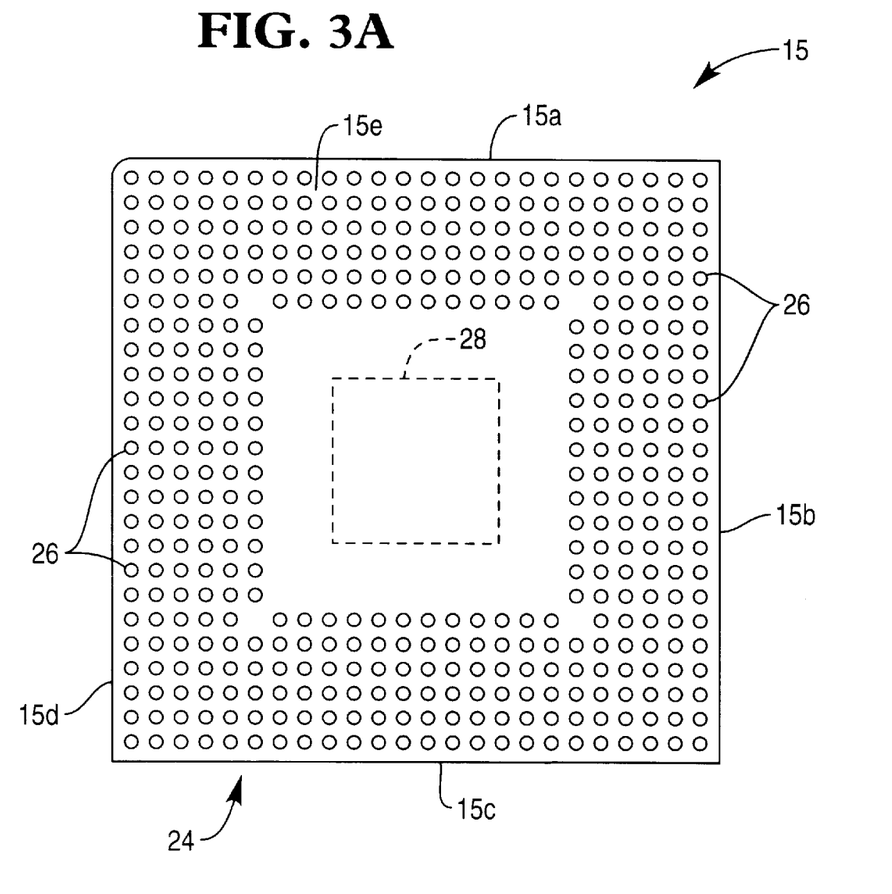
FIG. 3A is an enlarged bottom elevational view of the electronic package 15 of the securing assembly of FIG. 1.
Figure 3B:
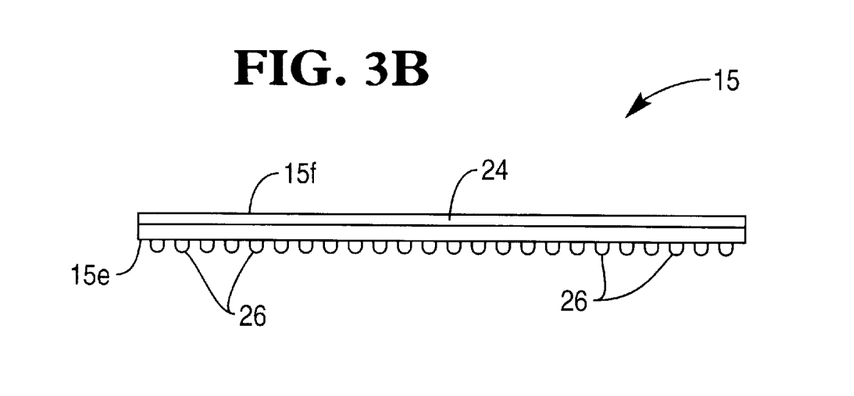
FIG. 3B is a side elevational view of the electronic package 15 of FIG. 3A.
Figure 5:
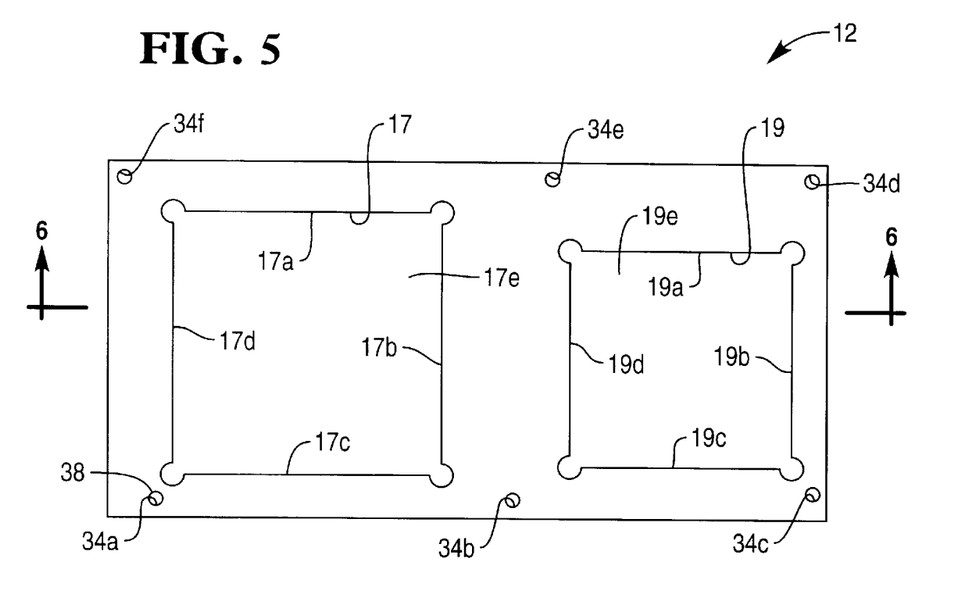
FIG. 5 is a reduced bottom elevational view of the retainer of the securing assembly of FIG. 1.
Figure 6:
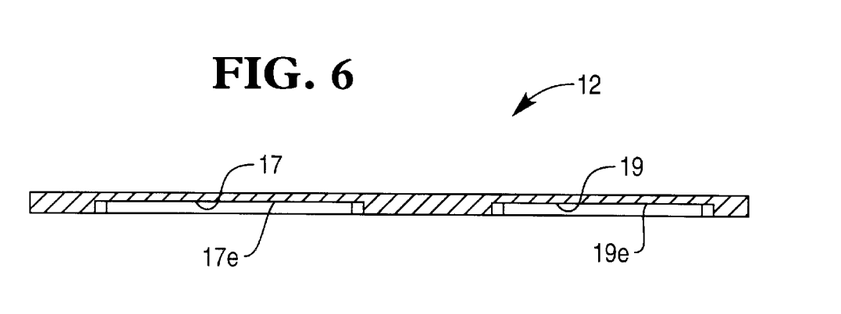
FIG. 6 is a cross sectional view taken along the line 6—6 of FIG. 5, as viewed in the direction of the arrows.
Figure 7:
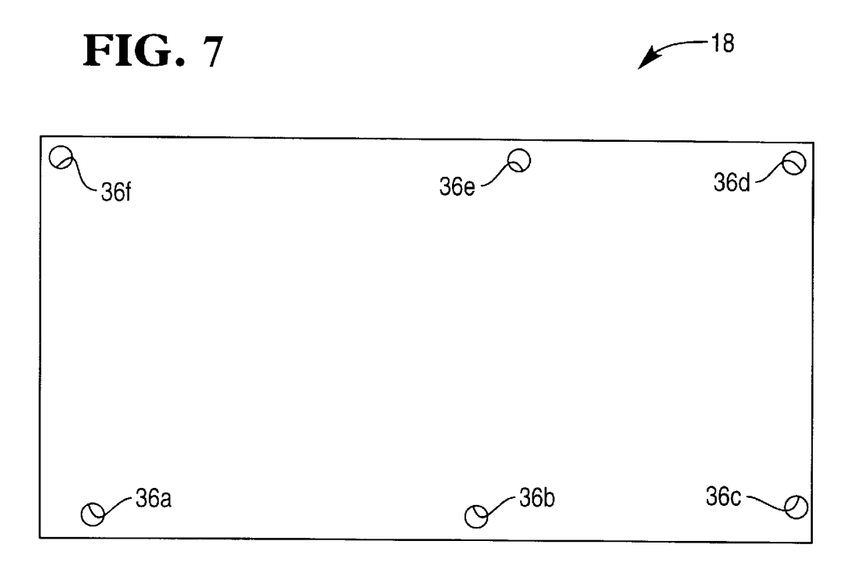
FIG. 7 is a reduced bottom elevational view of the back plate of the securing assembly of FIG. 1.

As shown in FIGS. 5 and 6, the retainer 12 is rectangular in shape and is an integrally formed single part that may be constructed of either plastic or metal. The retainer 12 further has a number of retainer apertures 34a–f defined therein. As shown in FIG. 1, the retainer apertures 34a–f respectively align with (1) the board apertures 32a–f defined in the circuit board 16, and (2) a number of plate apertures 36a–f defined in the back plate 18.

One of the bolts 20 is positioned in each of the board apertures 32a–f, the retainer apertures 34a–f, and the plate apertures 36a–f, and thereafter is threadingly engaged by the nuts 22 in order to secure the retainer 12 to a top surface 16a of the circuit board 16, while also securing the back plate 18 to a bottom surface 16b of the circuit board 16.

As shown in FIGS. 5–6, the retainer 12 has a pair of locating cavities 17,19 defined therein. The locating cavities 17,19 define a number of cavity sidewalls 17a–d, and 19a–d, respectively. The cavity sidewalls 17a–d, 19a–d are configured to secure and position the electronic packages 14,15, respectively. In particular, the size and location of the cavity sidewalls 17a–d, 19a–d are configured to conform closely to a number of outer edges 14a–d, 15a–d, respectively, defined by the electronic packages 14,15, respectively (see FIGS. 2A and 3A). It should be appreciated that when the electronic packages 14,15 are secured within the locating cavities 17,19, respectively, the outer edges 14a–d, 15a–d contact the sidewalls 17a–d, 19a–d thereby enabling the electronic packages 14,15 to be snap-fit or similarly secured within the locating cavities 17,19, respectively.

From the previous discussion, it should be appreciated that the size and location of the locating cavities 17,19 may be used to align the ball-shaped conductive pads 26 of the electronic packages 14,15, respectively, relative to the conductive pads 30a, 30b, respectively, of the circuit board 16. More specifically, once the electronic packages 14,15 are positioned in the locating cavities 17,19, respectively, the position of each of the ball-shaped conductive pads 26 may be measured relative to a center point 38 of the retainer aperture 34a (see FIG. 5). In particular, the location of each of the ball-shaped conductive pads 26 of the electronic packages 14, 15 may be defined as a first predetermined distance in the x-direction, and a second predetermined distance in the y-direction from the center point 38 of the retainer aperture 34a. Hence, the location of each of the ball-shaped conductive pads 26 of the electronic packages 14, 15 may also be predetermined in order to align with a corresponding conductive pad 30a, 30b, respectively, when the retainer 12 and the electronic packages 14, 15 are secured the circuit board 16.

Each of the locating cavities 17, 19 includes an engagement surface 17e, 19e, respectively, as shown in FIG. 5. When the bolts 20 are tightened, the retainer 12 and hence the engagement surfaces 17e, 19e are urged in the general direction of arrow C of FIG. 1 thereby causing the engagement surfaces 17e, 19e to contact an upper surface 14f, 15f, respectively, of the electronic packages 14, 15.

An interposer 40 (see FIG. 1) may be used to enhance the mechanical and electrical contact between the electronic packages 14, 15 and the circuit board 16. More specifically, the interposer 40 may be sandwiched between the ball-shaped conductive pads 26 of the electronic packages 14, 15 and the conductive pads 30a, 30b, respectively, of the circuit board 16. The interposer 40 is a elastomeric cloth material having anisotropic properties, and may be particularly useful for maintaining a reliable mechanical and electrical connection between the ball-shaped conductive pads 26 of the electronic packages 14, 15 and the conductive pads 30a, 30b, respectively, of the circuit board 16 despite any warpage or similar deformities that may be present in either the circuit board 16 or the retainer 12. Such an anisotropic material electrically conducts along a single axis, but does not conduct along any other axes. For example, the interposer 40 conducts along the axis defined by the general direction of arrow A of FIG. 1, but does conduct along any other axis (e.g. an axis defined by the general direction of arrow B of FIG. 1). Such a material is advantageous in that it does not have to be placed or otherwise positioned on the circuit board 16 by a high precision placement machine such as a "pick and place" machine. For example, the interposer 40 may be purchased in a roll or in pre-cut strips, and may thereafter be placed or otherwise positioned by hand on the conductive pads 30a, 30b of the circuit board 16 prior to the attachment thereto of the electronic packages 14, 15 and the retainer 12. One such material which may be suitable for use as the interposer 40 of the present invention is a part number ZC01507E-100 "Z-Axis Elastomer" which is commercially available from W.L. Gore and Associates, Inc. of Elkton, Md.

In operation, the interposer 40 may first be positioned on the conductive pads 30a, 30b of the circuit board 16. Thereafter, the electronic packages 14, 15 may be positioned on the interposer 40 in a position in which each of the ball-shaped conductive pads 24 is proximate a corresponding conductive pad 30a, 30b. Thereafter, the retainer 12 may be lowered onto the electronic packages 14, 15, in order to position and secure the electronic packages 14, 15 within the locating cavities 17, 19, respectively.

Once the retainer 12 is positioned on the circuit board 16, the bolts 20 are inserted through the retainer apertures 34a–f and the board apertures 32a–f. Thereafter, the back plate 18 is positioned on the bottom surface 16b of the circuit board 16 by advancing the bolts 20 through the plate apertures 36a–f. Thereafter, the nuts 22 are threadingly engaged with the bolts 20.

It should be appreciated that a downward or retaining force is exerted on the electronic packages 14, 15 when the bolts 20 are tightened. The bolts 20 may be further tightened in order to increase the retaining force being exerted on the electronic packages 14, 15, whereas the bolts 20 may be loosened to decrease the retaining force being exerted on the electronic packages 14, 15.

In order to remove the electronic packages 14, 15 from the circuit board 16, the nuts 22 are first removed from the bolts 20. Thereafter, the bolts 20 are removed thereby allowing the retainer 12 to be lifted away from the circuit board 16. Once the retainer 12 is lifted away from the circuit board 16, the electronic packages 14, 15 may then be removed. Thereafter, the same or different electronic packages 14, 15 may be secured to the circuit board 16 in the manner previously discussed.

Alternatively, the electronic packages 14, 15, respectively, may first be secured within the locating cavities 17, 19 of the retainer 12 prior to securing the retainer 12 to the circuit board 16. In particular, the electronic packages 14,15, may be friction-fit or otherwise secured in the locating cavities, 17, 19. Thereafter, the bolts 20 and the nuts 22 may be used to secure the retainer 12 to the circuit board 16 in the manner previously discussed.

Referring now to FIGS. 8–11, there is shown an electronic package securing assembly 50. The same reference numerals are used in FIGS. 8–11 to designate common components which were previously discussed in regard to FIGS. 1–7. Therefore, no further discussion thereof is warranted.

Figure 8:
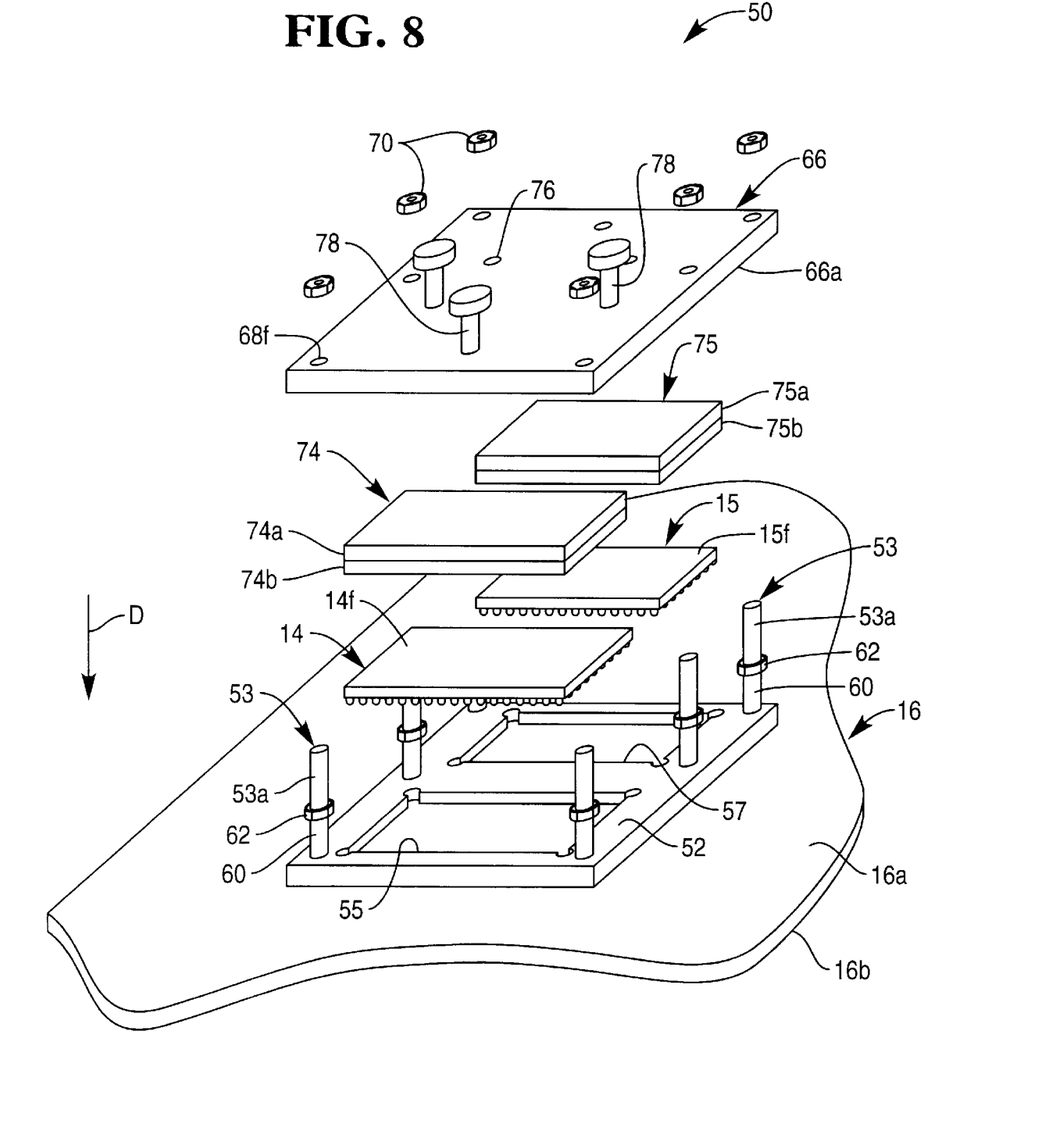
FIG. 8 is an exploded perspective view of a second embodiment of a electronic package securing assembly which incorporates the features of the present invention therein (Note: the printed circuit patterns, including the conductive pads 30a, 30b have been removed from the circuit board 16 for clarity of description)

The securing assembly 50 is essentially the same as the securing assembly 10, except that the retainer 12 has been replaced with a number of separate components. More specifically, the securing assembly 50 includes a locator 52 and a number of spacers 74, 75. As shall be discussed in more detail below, the locator 52 and the spacers 74, 75 collectively function equivalently as the retainer 12 of the securing assembly 10.

The securing assembly 50 further includes a number of bolts 53. The bolts 53 are installed from the bottom surface 16b of the circuit board 16 through the board apertures 32a–f of the circuit board 16 (see FIG. 4). Thereafter, the bolts 53 are received through a number of locator apertures 58a–f defined in the locator 52 (see FIG. 9). As shown in FIG. 8, a number of standoffs 60 and nuts 62 are secured to a threaded shaft portion 53a of each of the bolts 53 thereby securing the locator 52 to the circuit board 16.

Figure 9:
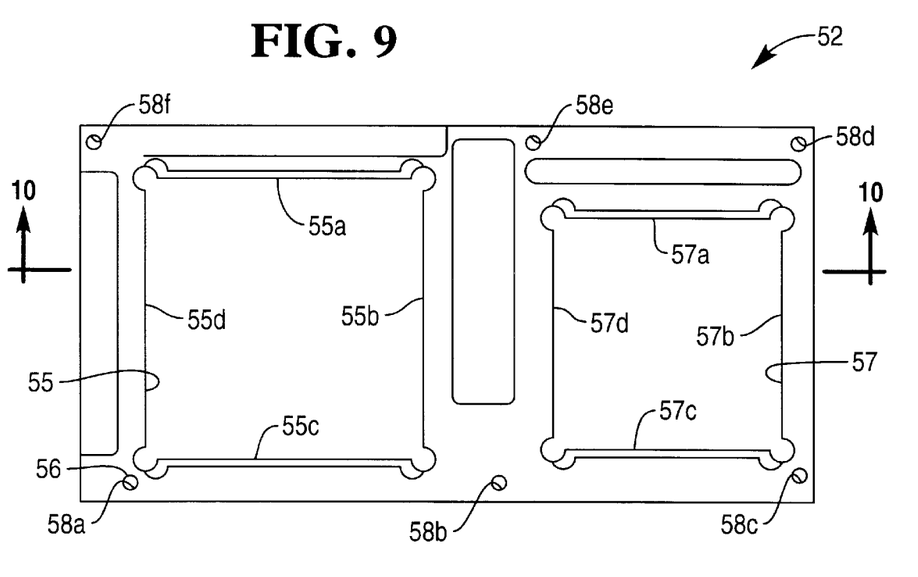
FIG. 9 is an enlarged bottom elevational view of the locator of the securing assembly of FIG. 8.
Figure 10:
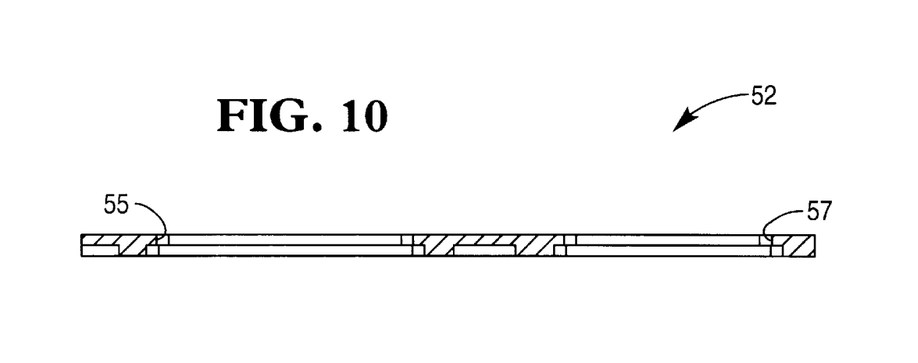
FIG. 10 is a cross sectional view taken along the line 10—10 of FIG. 9, as viewed in the direction of the arrows.

As shown in FIG. 9, the locator 52 has a number of locating cavities 55, 57 defined therein. As with the locating cavities 17, 19 of the retainer 12, the locating cavities 57, 59 define a number of cavity sidewalls 57a–d, and 59a–d, respectively. The cavity sidewalls 57a–d, 59a–d are configured to secure and position the electronic packages 14, 15, respectively. In particular, the size and location of the cavity sidewalls 57a–d, 59a–d are configured to conform closely to the outer edges 14a–d, 15a–d, respectively, defined in the electronic packages 14, 15, respectively. It should be appreciated that when the electronic packages 14, 15 are secured within the locating cavities 57, 59, respectively, the outer edges 14a–d, 15a–d contact the sidewalls 57a–d, 59a–d thereby enabling the electronic packages 14,15 to be secured within the locating cavities 17,19, respectively.

From the previous discussion, it should be appreciated that the size and location of the locating cavities 57, 59 may be used to align the ball-shaped conductive pads 26 of the electronic packages 14,15, respectively, relative to the conductive pads 30a, 30b, respectively, of the circuit board 16. More specifically, once the electronic packages 14,15 are positioned in the locating cavities 57, 59, respectively, the position of each of the ball-shaped conductive pads 26 may be measured relative to a center point 56 of the locator aperture 58a (see FIG. 9). In particular, the location of each of the ball-shaped conductive pads 26 of the electronic packages 14,15 may be defined as a first predetermined distance in the x-direction, and a second predetermined distance in the y-direction from the center point 56 of the locator aperture 58a. Hence, the location of each of the ball-shaped conductive pads 26 of the electronic packages 14,15 may also be predetermined in order to align with a corresponding conductive pad 30a, 30b, respectively, when the retainer 12 and the electronic packages 14,15 positioned therein are secured the circuit board 16.

Figure 11:
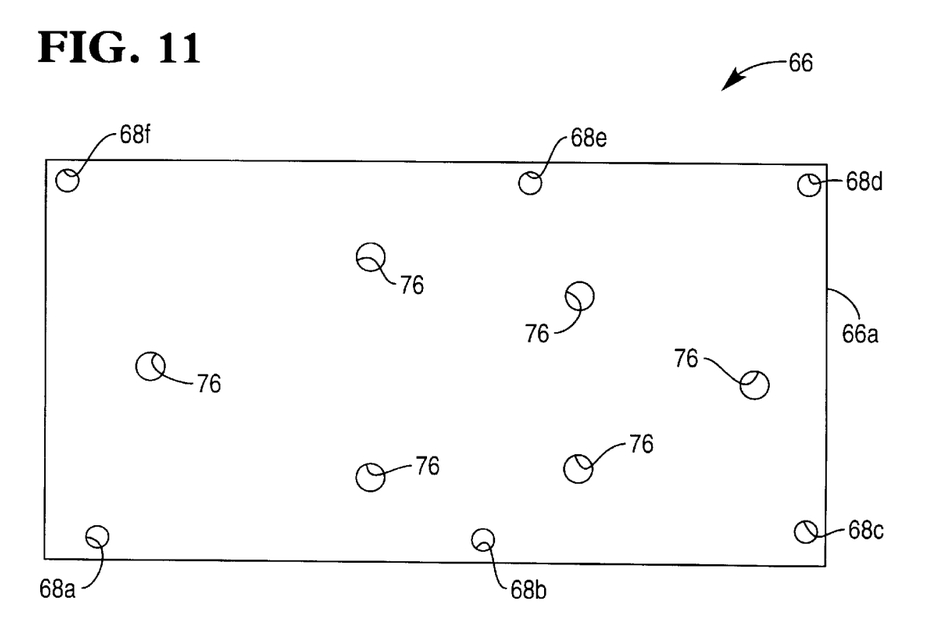
FIG. 11 is an enlarged bottom elevational view of the compressing plate of the electronic package securing assembly of FIG. 8.

The securing assembly 50 further includes a compressing plate 66. The compressing plate 66 has a number of plate apertures 68a–f defined therein, as shown in FIG. 11. The plate apertures 68a–f receive the bolts 53 therein (see FIG. 8). A bottom surface 66a of the compressing plate 66 contacts the nuts 62 thereby supporting the compressing plate 66. A number of locking nuts 70 are also received onto the threaded shaft portion 53a of the bolts 53 thereby securing the compressing plate 66 thereto.

As shown in FIG. 8, each of the spacers 74, 75 includes a metal upper portion 74a, 75a, and a rubber lower portion 74b, 75b, respectively. The spacers 74, 75 are urged in the general direction of arrow D of FIG. 8 thereby urging the electronic packages 14, 15, respectively, into contact with the circuit board 16. More specifically, the compressing plate 66 has a number of compressing holes 76 defined therein (see FIG. 11). A compressing bolt 78 is positioned in each of the compressing holes 76 as shown in FIG. 8. As the compressing bolts 78 are tightened, the compressing bolts 78 contact the metal upper portion 74a, 75a, of the spacers 74, 75, respectively, thereby urging the rubber lower portion 74b, 75b, of the spacers 74, 75, respectively, in the general direction of arrow D of FIG. 8 and into contact with the upper surface 14f, 15f of the electronic packages 14, 15, respectively. As the electronic packages 14, 15 are urged in the general direction of arrow D of FIG. 8, the ball-shaped conductive pads 26 of the electronic packages 14, 15 are likewise urged into mechanical and electrical contact with the conductive pads 30a, 30b, (see FIG. 4) respectively, of the circuit board 16. It should therefore be appreciated that the compressing bolts 78 may be used to alter the retaining force being exerted on the upper surfaces 14f, 15f of the electronic packages 14, 15, respectively. In particular, if the compressing bolts 78 are tightened, the retaining force exerted on the electronic packages 14, 15 will be increased, whereas if the compressing bolts 78 are loosened, the retaining force exerted on the electronic packages 14, 15 will be decreased.

Prior to placing the electronic packages 14,15 within the locating cavities 55, 57, respectively, the interposer 40 (not shown in FIG. 8, but see FIG. 1) may first be positioned within each of the locating cavities 55, 57. In particular, the interposer 40 may be positioned within the locating cavities 55, 57 (i.e. on the conductive pass 30a, 30b) prior to placing and aligning the ball-shaped conductive pads 26 of the electronic packages 14, 15, respectively, into contact with the conductive pads 30a, 30b.

In operation, the bolts 53 are first installed from the bottom surface 16b of the circuit board 16. Thereafter, the locator 52 is lowered onto the circuit board 16 by advancing the bolts 53 through the locator apertures 58a–f. Then, the interposer 40 may be positioned on the conductive pads 30a, 30b of the circuit board 16. Thereafter, the electronic packages 14, 15 may be positioned on the interposer 40 within the locating cavities 55, 57 in a position in which each of the ball-shaped conductive pads 24 is proximate a corresponding conductive pad 30a, 30b. The rubber lower portions 74b, 75b, respectively, of the spacers 74, 75 may then be lowered onto, and into contact with, the upper surfaces 14f, 15f, respectively, of the electronic packages 14,15.

The compressing plate may then be lowered onto the nuts 62 by advancing the bolts 53 through the plate apertures 68a–f. Thereafter, the locking nuts 70 are threadingly engaged with the bolts 53 thereby securing the compressing plate 66 thereto. Once the compressing plate 66 is secured to the bolts 53, the compressing bolts 78 are inserted through the compressing holes 76.

It should be appreciated that a downward or retaining force is exerted on the electronic packages 14, 15 when the compressing bolts 78 are tightened. The compressing bolts 78 may be further tightened in order to increase the retaining force being exerted on the electronic packages 14, 15, whereas the compressing bolts 78 may be loosened to decrease the retaining force being exerted on the electronic packages 14, 15.

In order to remove the electronic packages 14, 15 from the circuit board 16, the compressing bolts are first loosened. Thereafter, the locking nuts 70 are removed from the bolts 53. After which, the compressing plate 66 may be lifted away from the bolts 53, and thereafter the spacers 74, 75 may be removed. Once the spacers 74, 75 are lifted away, the electronic packages 14, 15 may then be removed. Thereafter, the same or different electronic packages 14, 15 may be secured to the circuit board 16 in the manner previously discussed.

While the invention has been illustrated and described in detail in the drawings and foregoing description, such illustration and description is to be considered as exemplary and not restrictive in character, it being understood that only the preferred embodiments have been shown and described and that all changes and modifications that come within the spirit of the invention are desired to be protected.

Although the bolts 20, 53 and the nuts 22, 62, 70 have been described as a manner in which the retainer may be secured to the circuit board 16 and have significant benefits in their use in the present invention, many of the advantageous of the present invention may be achieved by the use of other types of fasteners. For example, the retainer may be secured to the circuit board by using a clamp or other similar fastening device.

It should be appreciated that the back plate 18 (see FIG. 1) may be integrated into another component associated with an electronic assembly. For example, the back plate 18 may be integrated into a chassis associated with the electronic assembly, as opposed to being provided as a separate, discrete component.

In addition, although the securing assembly 10 (see FIG. 1) has been described as including the back plate 18 and has significant benefits in its use in the present invention, many of the advantageous of the present invention may be achieved without the use of the back plate 10. In particular, the bolts 20 may be threadingly engaged into the circuit board 16 thereby eliminating the need for the back plate 18.

Moreover, although the securing assembly 50 has been described to include the spacers 74, 75 and has significant benefits in their use in the present invention, many of the advantageous of the present invention may be achieved without the use of the spacers 74, 75. For example, the compressing bolts 78 may be provided with rubber tips and be urged into contact with the upper surfaces 14f, 15f of the electronic packages 14, 15, respectively.

What is claimed is:

1. A method of securing an electronic package which has a number of first conductive pads to a circuit board which has a number of second conductive pads, comprising the steps of:

providing a retainer having a locating cavity defined therein;

positioning said electronic package within said locating cavity so that said electronic package is fixed in relationship to said retainer; and securing said retainer in fixed relationship to said circuit board so as to (i) sandwich said electronic package between said retainer and said circuit board, and (ii) align said number of first conductive pads into contact with said number of second conductive pads so that electrical contact is created therebetween, wherein said securing step is performed after said positioning step.

2. The method of claim 1, further comprising the step of:

attaching a back plate to said circuit board so as to sandwich said electronic package and said circuit board between said retainer and said back plate.

3. The method of claim 2, wherein:

said retainer has a first aperture defined therein, said circuit board has a second aperture defined therein, said back plate has a third aperture defined therein, and said securing step includes the step of positioning a bolt within each of said first aperture, said second aperture, and said third aperture.

4. The method of claim 1, wherein said securing step further includes the step of positioning a cloth interposer having anisotropic properties between said number of first conductive pads and said number of second conductive pads.

5. The method of claim 1, wherein said retainer includes (1) a locator having said locating cavity defined therein, and (2) a compressing plate which is fastenable to said locator, wherein said securing step includes the steps of:

attaching said locator to said circuit board, and fastening said compressing plate to said locator.

6. The method of claim 5, wherein said retainer further includes a spacer and a compressing bolt, wherein said securing step further includes the steps of:

positioning said spacer between said compressing plate and said electronic package;

inserting said compressing bolt into a compressing hole defined in said compressing plate; and advancing said compressing bolt into contact with said spacer so as to cause said spacer to urge said electronic package into operative contact with said circuit board.

7. The method of claim 6, wherein:

said spacer includes a metal portion and a rubber portion, said securing step further includes the steps of (1) advancing said metal portion of said spacer into contact with said compressing bolt, and (2) advancing said electronic package into contact with said rubber portion of said spacer.

8. An apparatus for securing an electronic package to a circuit board, comprising a retainer securable to said circuit board, wherein:

said retainer has a locating cavity defined therein, said electronic package is positionable within said locating cavity, said locating cavity is configured to prevent movement of said electronic package relative to said retainer when said electronic package is positioned within said locating cavity, said electronic package has a number of first conductive pads, said circuit board has a number of second conductive pads, and said number of first conductive pads contacts said number of second conductive pads when (1) said electronic package is positioned within said locating cavity, and (2) said retainer is secured to said circuit board.

9. The apparatus of claim 8, further comprising a back plate, wherein:

said circuit board includes a first side and a second side, said retainer is secured to said first side of said circuit board, and said back plate is secured to said second side of said circuit board as to sandwich said electronic package and said circuit board between said retainer and said back plate.

10. The apparatus of claim 8, further comprising means for securing said retainer to said circuit board so that said electronic package is secured between said retainer and said circuit board.

11. The apparatus of claim 10, wherein:

said retainer has a first aperture defined therein, said circuit board has a second aperture defined therein, and said securing means includes a bolt which is positionable within said first aperture and said second aperture.

12. The apparatus of claim 8, wherein said retainer includes (1) a locator having said locating cavity defined therein, and (2) a compressing plate fastened to said locator.

13. The apparatus of claim 12, further comprising (1) a spacer positionable between said compressing plate and said electronic package; and (2) a compressing bolt, wherein:

said compressing plate has a compressing hole defined therein, said compressing bolt is positioned in said compressing hole and in contact with said spacer so as to cause said spacer to urge said electronic package into operative contact with said circuit board.

14. The apparatus of claim 13, wherein:

said spacer includes a metal portion and a rubber portion, said compressing bolt contacts said metal portion of said spacer, and said rubber portion of said spacer contacts said electronic package.

15. An apparatus for securing an electronic package to a circuit board, comprising:

a retainer having a locating cavity defined therein, wherein (1) said retainer is securable to said circuit board, and (2) said electronic package is positionable within said locating cavity; and a cloth interposer having anisotropic properties, said cloth interposer being positionable between said electronic package and said circuit board when said electronic package is sandwiched between retainer and said circuit board.

16. The apparatus of claim 15, wherein:

said locating cavity is configured to prevent movement of said electronic package relative to said retainer when said electronic package is positioned within said locating cavity, said electronic package has a number of first conductive pads, said circuit board has a number of second conductive pads, and said number of first conductive pads contacts said number of second conductive pads when (1) said electronic package is positioned within said locating cavity, and (2) said retainer is secured to said circuit board.

17. The apparatus of claim 15, wherein said retainer includes (1) a locator having said locating cavity defined therein, and (2) a compressing plate fastened to said locator.

18. The apparatus of claim 17, further comprising (1) a spacer positionable between said compressing plate and said electronic package; and (2) a compressing bolt, wherein:

said compressing plate has a compressing hole defined therein, said compressing bolt is positioned in said compressing hole and in contact with said spacer so as to cause said spacer to urge said electronic package into operative contact with said circuit board.

19. The apparatus of claim 18, wherein:

said spacer includes a metal portion and a rubber portion, said compressing bolt contacts said metal portion of said spacer, and said rubber portion of said spacer contacts said electronic package.

* * * * *